United States Patent
Xu et al.

(10) Patent No.: US 9,374,931 B2
(45) Date of Patent: Jun. 21, 2016

(54) GRAPHIC CARD WITH MULTIPLE FANS AND CONTROLLING METHOD THEREOF

(71) Applicants: Bing-Bing Xu, Singapore (SG); Zhao-Long Dong, Singapore (SG); Ching-Ji Liang, Singapore (SG)

(72) Inventors: Bing-Bing Xu, Singapore (SG); Zhao-Long Dong, Singapore (SG); Ching-Ji Liang, Singapore (SG)

(73) Assignee: ASUS GLOBAL PTE. LTD., Singapore (SG)

( * ) Notice: Subject to any disclaimer, the term of this patent is extended or adjusted under 35 U.S.C. 154(b) by 406 days.

(21) Appl. No.: 13/950,297

(22) Filed: Jul. 25, 2013

(65) Prior Publication Data

US 2014/0036443 A1 Feb. 6, 2014

(30) Foreign Application Priority Data

Aug. 1, 2012 (CN) .......................... 2012 1 0272331

(51) Int. Cl.
*G06F 19/00* (2011.01)
*H05K 7/20* (2006.01)
*G06F 1/20* (2006.01)

(52) U.S. Cl.
CPC ............ *H05K 7/20209* (2013.01); *G06F 1/206* (2013.01)

(58) Field of Classification Search
CPC .... H01L 23/467; G06F 1/20; G05D 23/1931; H05K 7/20209
USPC ........................................................ 700/300
See application file for complete search history.

(56) References Cited

U.S. PATENT DOCUMENTS

| | | | |
|---|---|---|---|
| 5,864,465 A * | 1/1999 | Liu .......................... | G06F 1/206 174/16.3 |
| 6,856,139 B2 | 2/2005 | Rijken et al. | |
| 2002/0088615 A1 * | 7/2002 | Dixon ....................... | G06F 1/20 165/287 |
| 2003/0015983 A1 * | 1/2003 | Montero ................. | G06F 1/206 318/473 |
| 2003/0216882 A1 * | 11/2003 | Lai ............................ | G06F 1/20 702/132 |
| 2007/0133178 A1 * | 6/2007 | Han .......................... | G06F 1/20 361/719 |
| 2008/0035315 A1 * | 2/2008 | Han ........................ | F04D 17/04 165/121 |
| 2008/0170947 A1 * | 7/2008 | Sutardja ................... | G06F 1/206 417/32 |
| 2011/0245991 A1 * | 10/2011 | Keown, Jr. .............. | G06F 1/206 700/300 |
| 2014/0036443 A1 * | 2/2014 | Xu ....................... | H05K 7/20209 361/695 |

FOREIGN PATENT DOCUMENTS

| CN | 1467459 | 1/2004 |
|---|---|---|
| CN | 101739104 | 6/2010 |

* cited by examiner

*Primary Examiner* — Michael D Masinick
(74) *Attorney, Agent, or Firm* — Jianq Chyun IP Office (57) ABSTRACT

A graphic card with multiple fans and a controlling method thereof are provided. In the controlling method, the temperature of a first component and a second component of the graphic card is detected. A rotating speed of a first fan of the graphic card is adjusted according to the temperature of the first component. The rotating speed of the second fan of the graphic card is adjusted according to the temperature of the second component or the temperature of the first component and the second component.

10 Claims, 8 Drawing Sheets

GRAPHIC CARD WITH MULTIPLE FANS AND CONTROLLING METHOD THEREOF

CROSS-REFERENCE TO RELATED APPLICATION

This application claims the priority benefit of China application serial No. 201210272331.1, filed on Aug. 1, 2012. The entirety of the above-mentioned patent application is hereby incorporated by reference herein and made a part of specification.

BACKGROUND OF THE INVENTION

1. Field of the Invention

The disclosure relates to a graphic card with multiple fans and a controlling method thereof.

2. Description of the Related Art

Conventionally, a graphic card with double fans can control the rotating speed of the two fans according to the temperature of a graphics processing unit (GPU).

When the graphic card has a heavy load, the temperature of the GPU is effectively reduced by an exclusive heat dissipater, and the two fans operate at a low rotating speed. Thus, the temperature of other components (such as a power supply circuit) at the graphic card may become too high due to high load operation.

However, no matter the temperature of the power supply circuit is too high or not, the fans controlled by the temperature of the GPU keep operating at the low rotating speed. Thus, in the conventional graphic card, it may occur that the power supply circuit operates in high temperature, but the two fans operate at a low rotating speed. If the temperature of the power supply circuit is too high, the graphic card may operate under-clocking and crash, which affects the performance of the graphic card seriously. Furthermore, if the graphic card operates at high temperature for a long time, the service life may be shortened.

BRIEF SUMMARY OF THE INVENTION

A graphic card with multiple fans and a controlling method thereof are provided. The graphic card can adjust a rotating speed of the multiple fans according to temperature of different components.

A controlling method of a graphic card with multiple fans includes following steps: detecting temperature of a first component and a second component of the graphic card; adjusting a rotating speed of a first fan of the graphic card according to the temperature of the first component; and adjusting the rotating speed of a second fan according to a comparing result between the temperature of the first component and the temperature of the second component.

A graphic card with multiple fans includes a first component, a second component, a first temperature sensor, a second temperature sensor, a first fan, a second fan and a control unit. The first component, the second component, the first temperature sensor and the second temperature sensor are disposed at the graphic card. The first temperature sensor and the second temperature sensor detect the temperature of the first component and the second component, respectively. The first fan and the second fan provide first cooling air and second cooling air, respectively, to the graphic card. The control unit is coupled to the first temperature sensor, the second temperature sensor, the first fan and the second fan. The control unit adjusts the rotating speed of the first fan according to the temperature of the first component. The control unit adjusts the rotating speed of the second fan according to a comparing result of the temperature of the first component and the temperature of the second component.

In an embodiment, the first component a GPU of the graphic card, and the second component is a random access memory (RAM) or a power supply circuit of the graphic card.

These and other features, aspects and advantages of the present disclosure will become better understood with regard to the following description, appended claims, and accompanying drawings.

DETAILED DESCRIPTION OF THE EMBODIMENTS

Figure 1:
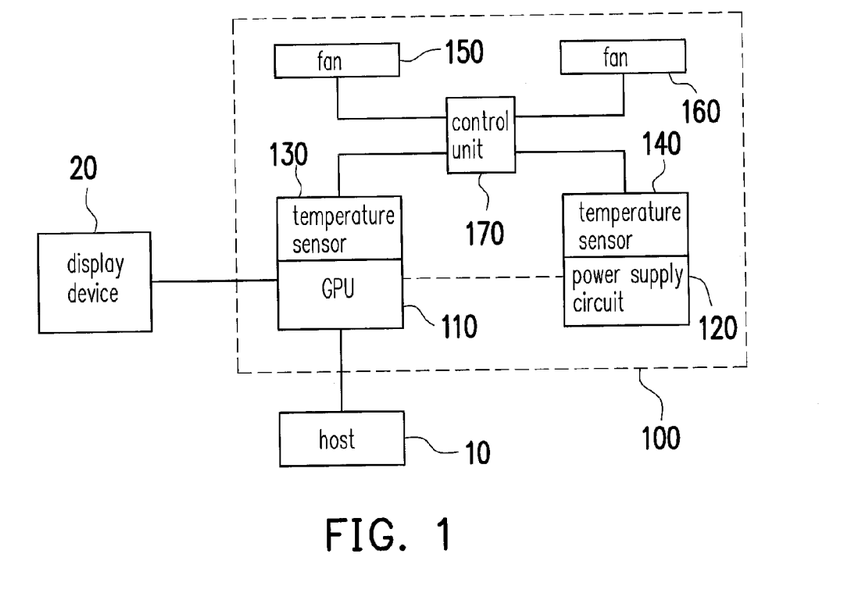
FIG. 1 is a block diagram showing a graphic card with multiple fans in an embodiment.

FIG. 1 is a block diagram showing a graphic card 100 with multiple fans in an embodiment. The graphic card 100 processes image data from a host 10, and drives a display device 20 according to a processing result. The graphic card 100 includes a first component and a second component disposed thereon.

In the embodiment, the first component may be a GPU 110 of the graphic card 100, and the second component may be a power supply circuit 120 of the graphic card 100.

The power supply circuit 120 is coupled to the GPU 110 directly or indirectly to provide power to the GPU 110. The second component may also be other circuits of the graphic card 100, such as a random access memory (RAM).

Please refer to FIG. 1, the graphic card 100 further includes a first temperature sensor 130, a second temperature sensor 140, a first fan 150, a second fan 160 and a control unit 170.

The control unit 170 is coupled to the first temperature sensor 130, the second temperature sensor 140, the first fan 150 and the second fan 160. The first temperature sensor 130 and the second temperature sensor 140 are disposed at the graphic card 100.

The first temperature sensor 130 may be near the GPU 110 to detect the temperature of the GPU 110. The second temperature sensor 140 is near the power supply circuit 120 to detect the temperature of the power supply circuit 120.

The first fan 150 may provide first cooling air to the graphic card 100. The second fan 160 may provide second cooling air to the graphic card 100.

Figure 2:
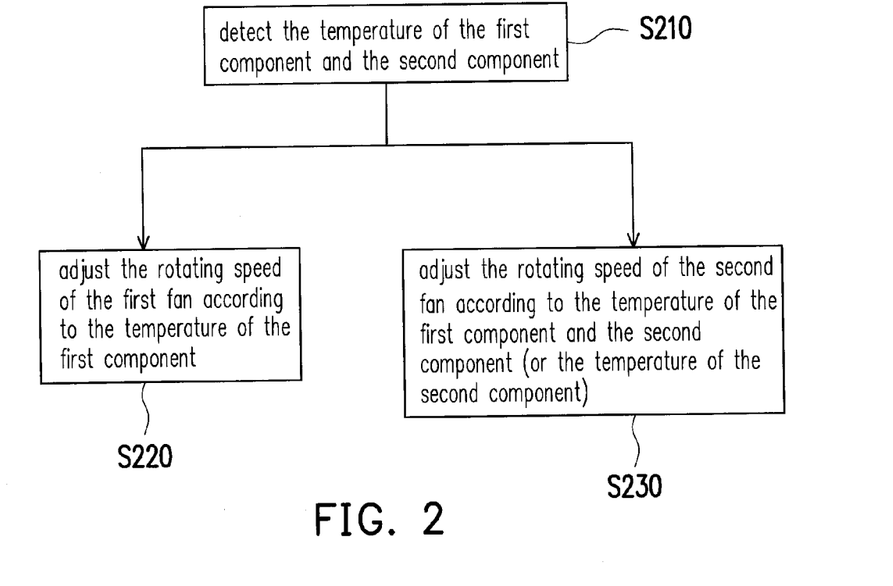
FIG. 2 is a flow chart showing a controlling method of a graphic card with multiple fans in an embodiment.

FIG. 2 is a flow chart showing a controlling method of a graphic card with multiple fans in an embodiment.

Please refer to FIG. 1 and FIG. 2, in step S210, the control unit 170 detects the temperature of the first component (such as the GPU 110) of the graphic card 100 by the first temperature sensor 130, and detects the temperature of the second component (such as the power supply circuit 120) of the graphic card 100 by the second temperature sensor 140. The control unit 170 adjusts the rotating speed of the first fan 150 according to the temperature of the GPU 110 (step S220). The control unit 170 adjusts the rotating speed of the second fan 160 according to the temperature of the power supply circuit 120 or the temperature of the GPU 110 and the power supply circuit 120 (step S230).

Figure 3:
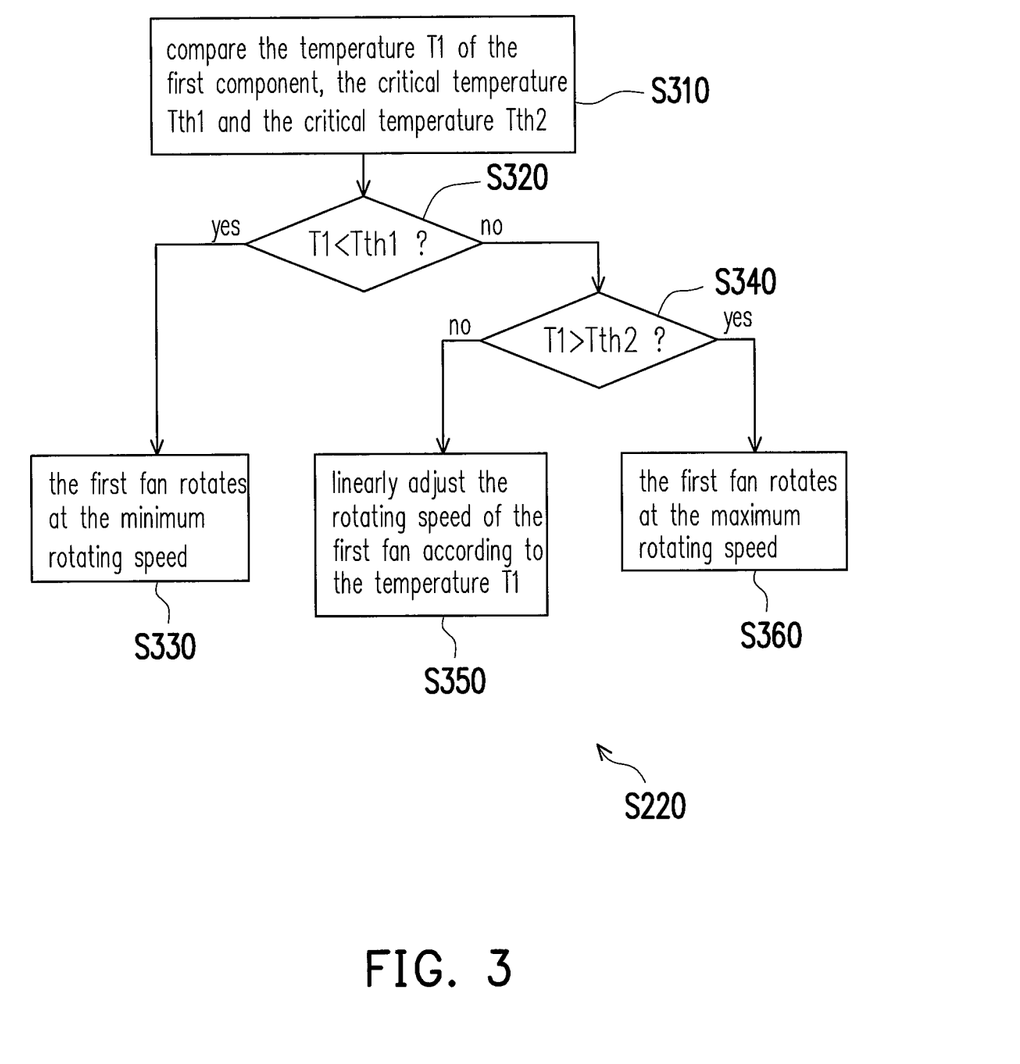
FIG. 3 is a flow chart showing a sub-process of a step S220 in FIG. 2.

FIG. 3 is a flow chart showing a sub-process of a step S220 in FIG. 2. The step S220 includes sub steps S310 to S360. Please refer to FIG. 1 and FIG. 3, in step S310, the control unit 170 compares the temperature T1 of the first component (such as the GPU 110), the critical temperature Tth1 and the critical temperature Tth2. The critical temperature Tth1 and the critical temperature Tth2 are determined according to requirements of products. The critical temperature Tth1 is lower than the critical temperature Tth2.

In step S320, the control unit 170 determines whether the temperature T1 is lower than the critical temperature Tth1. When the temperature T1 of the GPU 110 is lower than the critical temperature Tth1, the control unit 170 controls the first fan 150 to rotate at a minimum rotating speed in step S330. The minimum rotating speed may be determined according to requirements of products. If the temperature T1 is not lower than the temperature Tth1, the control unit 170 determines whether the temperature T1 is higher than the temperature Tth2 in S340.

When the temperature T1 of the GPU 110 is higher than the critical temperature Tth2, the control unit 170 controls the first fan 150 to rotate at a maximum rotating speed in step S360. The maximum rotating speed may be determined according to requirements of products. When the temperature T1 of the GPU 110 is between the critical temperature Tth1 and the critical temperature Tth2, the control unit 170 may linearly adjust the rotating speed of the first fan 150 between the minimum rotating speed and the maximum rotating speed according to the temperature T1 of the GPU 110 in step S350.

Figure 4A:
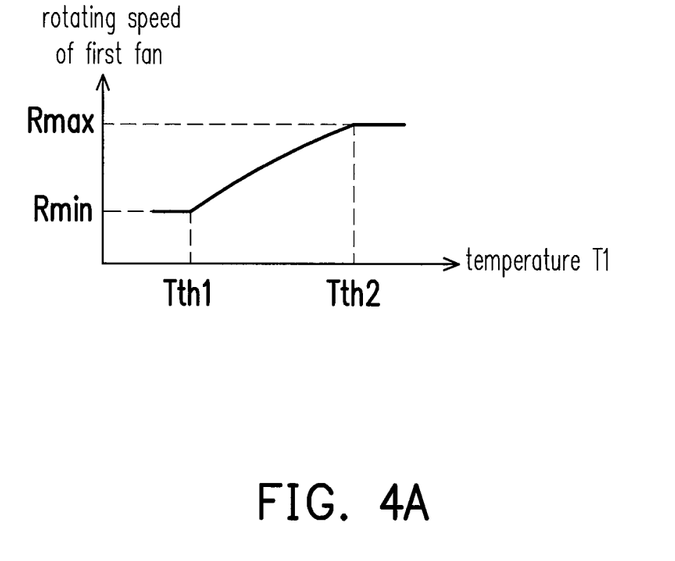
FIG. 4A and FIG. 4B are graphs showing a relation curve of temperature T1 of a GPU and a rotating speed of a first fan in FIG. 1 in different embodiments.

For example, FIG. 4A is a graph showing a relation curve of the temperature T1 of the GPU 110 and the rotating speed of the first fan 150 in FIG. 1 in an embodiment.

When the temperature T1 of the GPU 110 is lower than the critical temperature Tth1 (such as 45° C.), the control unit 170 controls the first fan 150 to rotate at the minimum rotating speed Rmin. The control unit 170 can send a pulse width modulation (PWM) with a duty ratio of 50% to drive the first fan 150 and control the first fan 150 to rotate at the minimum rotating speed Rmin.

When the temperature T1 of the GPU 110 is higher than the critical temperature Tth2 (such as 85° C.), the control unit 170 controls the first fan 150 to rotate at the maximum rotating speed Rmax. The control unit 170 can send a PWM signal with a duty ratio of 100% to drive the first fan 150 and control the first fan 150 to rotate at the maximum rotating speed Rmax.

When the temperature T1 is between the critical temperature Tth1 and the critical temperature Tth2, the control unit 170 linearly controls the first fan 150 to rotate at a rotating speed between the minimum rotating speed Rmin and the maximum rotating speed Rmax according to the temperature T1 of the GPU 110, as shown in FIG. 4A.

However, the relation of the temperature T1 of the GPU 110 and the rotating speed of the first fan 150 is not limited to the embodiment in FIG. 4A.

Figure 4B:
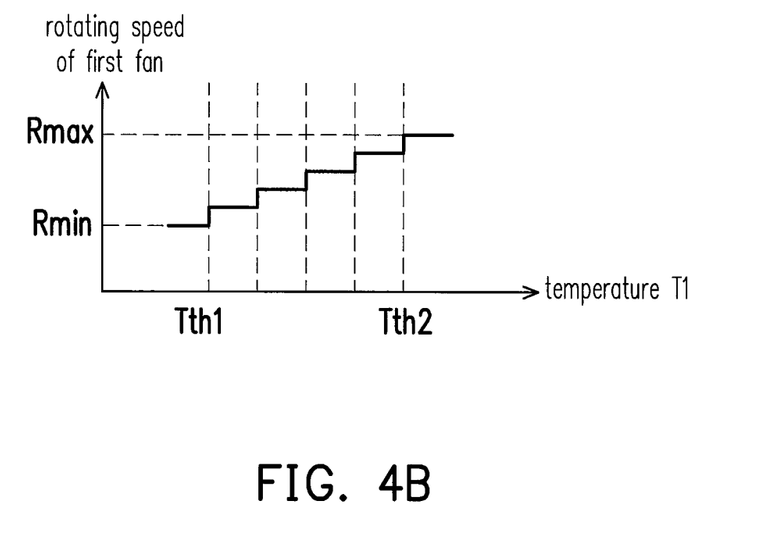

FIG. 4B is a graph showing a relation curve of temperature T1 of the GPU 110 and the rotating speed of the first fan 150 in FIG. 1 in another embodiment.

Please refer to FIG. 4B, when the temperature T1 of the GPU 110 is lower than the critical temperature Tth1 (such as 40° C.), the control unit 170 controls the first fan 150 to rotate at the minimum rotating speed Rmin.

When the temperature T1 of the GPU 110 is higher than the critical temperature Tth2 (such as 80° C.), the control unit 170 controls the first fan 150 to rotate at the maximum rotating speed Rmax.

In the embodiment, the range between the critical temperature Tth1 and the critical temperature Tth2 is divided into multiple different temperature ranges, and each temperature range corresponds to a rotating speed, as shown in FIG. 4B. When the temperature T1 is between the critical temperature Tth1 and the critical temperature Tth2, the control unit 170 may discretely adjust the rotating speed of the first fan 150 according to the temperature T1 of the GPU 110. That is, when the temperature T1 is between the critical temperature Tth1 and the critical temperature Tth2, the control unit 170 adjusts the rotating speed of the first fan 150 according to which temperature range the temperature T1 is at.

Figure 5:
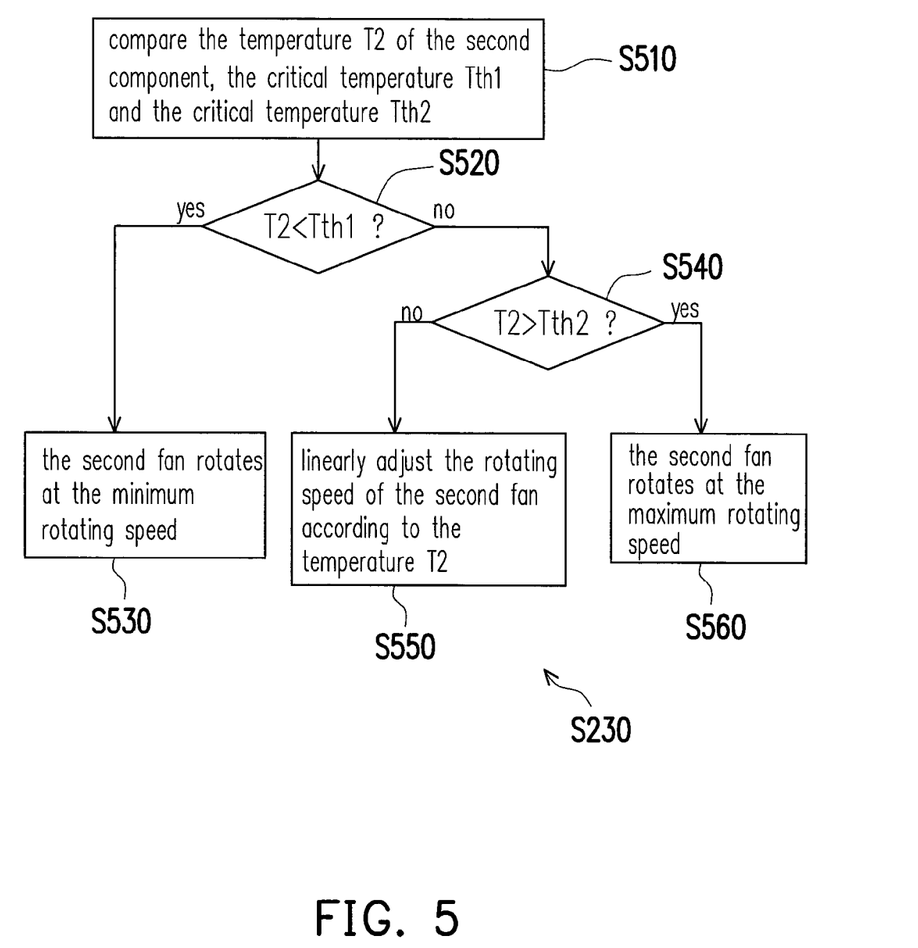
FIG. 5 is a flow chart showing a sub-process of a step S230 in FIG. 2 in a first embodiment.

FIG. 5 is a flow chart showing a sub-process of a step S230 in FIG. 2 in a first embodiment. In the embodiment, the step S230 includes sub steps S510 to S560. Please refer to FIG. 1 and FIG. 5, the control unit 170 compares the temperature T2 of the second component (such as the power supply circuit 120), the critical temperature Tth1 and the critical temperature Tth2 in step S510. The critical temperature Tth1 and the critical temperature Tth2 may be determined according requirements of products. The critical temperature Tth1 is lower than the critical temperature Tth2.

The control unit 170 determines whether the temperature T2 is lower than the temperature Tth1 in step S520. When the temperature T2 of the power supply circuit 120 is lower than the critical temperature Tth1, the control unit 170 controls the rotating speed of the second fan 160 at the minimum rotating speed in step S530. If the temperature T2 is not lower than the temperature Tth1, the control unit 170 determines whether the temperature T2 is higher than the temperature Tth2 in step S540.

When the temperature T2 of the power supply circuit 120 is higher than the critical temperature Tth2, the control unit 170 controls the rotating speed of the second fan 160 at the maximum rotating speed in step S560.

When the temperature T2 of the power supply circuit 120 is between the critical temperature Tth1 and the critical temperature Tth2, the control unit 170 linearly controls the second fan 160 to rotate at a speed between the minimum rotating speed and the maximum rotating speed according to the temperature T2 of the power supply circuit 120 in step S550.

Figure 6A:
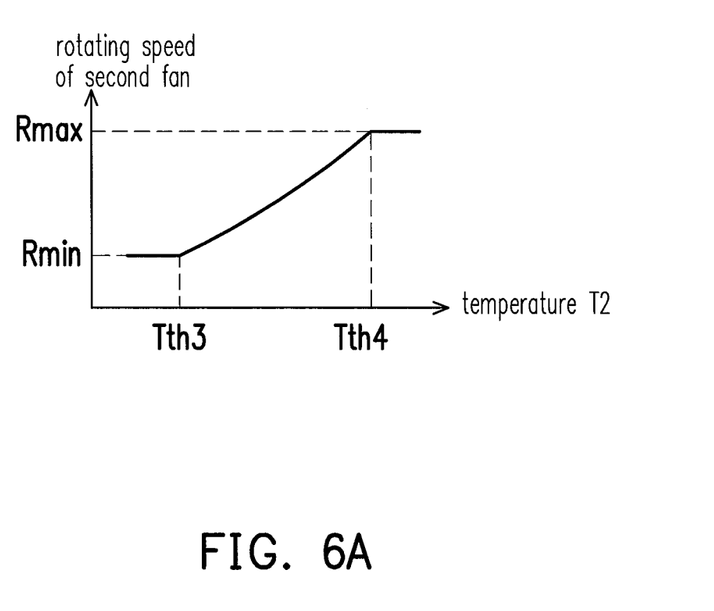
FIG. 6A and FIG. 6B are graphs showing a relation curve of temperature T2 of a power supply circuit and a rotating speed of a second fan in FIG. 1 in different embodiments.

FIG. 6A is a graph showing a relation curve of temperature T2 of the power supply circuit 120 and the rotating speed of the second fan 160 in FIG. 1. When the temperature T2 of the power supply circuit 120 is lower than the critical temperature Tth3 (such as 45° C.), the control unit 170 controls the second fan 160 to rotate at the minimum rotating speed Rmin. The control unit 170 sends out a PWM signal with a duty ratio of 50% to drive the second fan 160 and keep the second fan 160 to rotate at the minimum rotating speed Rmin.

When the temperature T2 of the power supply circuit 120 is higher than the critical temperature Tth4 (such as 95° C.), the control unit 170 controls the second fan 160 to rotate at the maximum rotating speed Rmax. The control unit 170 sends out a PWM signal with a duty ratio of 100% to drive the second fan 160 and keep the second fan 160 to rotate at the maximum rotating speed Rmax.

When the temperature T2 is between the critical temperature Tth3 and the critical temperature Tth4, the control unit 170 linearly adjusts the rotating speed of the second fan 160 between the minimum rotating speed Rmin and the maximum rotating speed Rmax according to the temperature T2 of the power supply circuit 120, as shown in FIG. 6A.

However, the relation between the temperature T2 of the power supply circuit 120 and the rotating speed of the second fan 160 is not limited to the embodiment shown in FIG. 6A.

Figure 6B:
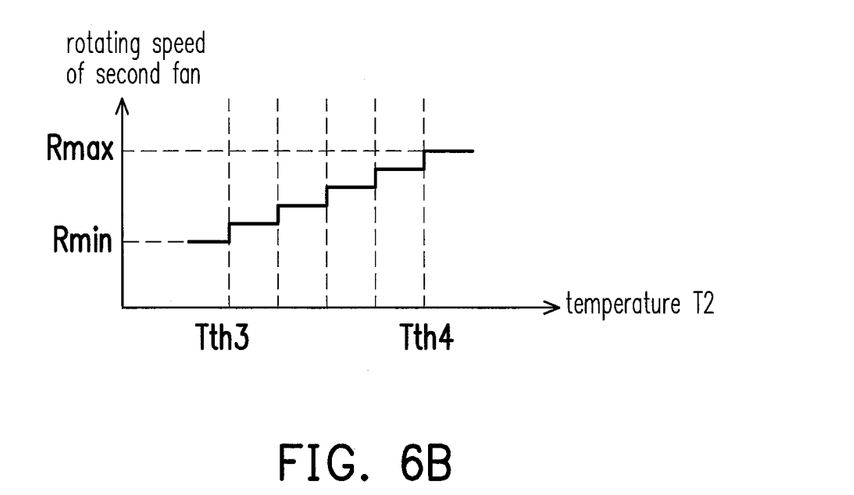

FIG. 6B is a graph showing a relation curve of temperature T2 of the power supply circuit 120 and the rotating speed of the second fan 160 in FIG. 1 in another embodiment.

Please refer to FIG. 6B, when the temperature T2 of the power supply circuit 120 is lower than the critical temperature Tth3 (such as 50° C.), the control unit 170 controls the second fan 160 to rotate at the minimum rotating speed Rmin.

When the temperature T2 of the power supply circuit 120 is higher than the critical temperature Tth4 (such as 90° C.), the control unit 170 controls the second fan 160 to rotate at the maximum rotating speed Rmax.

In the embodiment, the range between the critical temperature Tth3 and the critical temperature Tth4 is divided into multiple different temperature ranges, and each temperature range corresponds to a rotating speed, as shown in FIG. 6B. When the temperature T2 is between the critical temperature Tth3 and the critical temperature Tth4, the control unit 170 discretely adjusts the rotating speed of the second fan 160 according to the temperature T2 of the power supply circuit 120. That is, when the temperature T2 is between the critical temperature Tth3 and the critical temperature Tth4, the control unit 170 adjusts the rotating speed of the second fan 160 according to which temperature range the temperature T2 is at.

Figure 7:
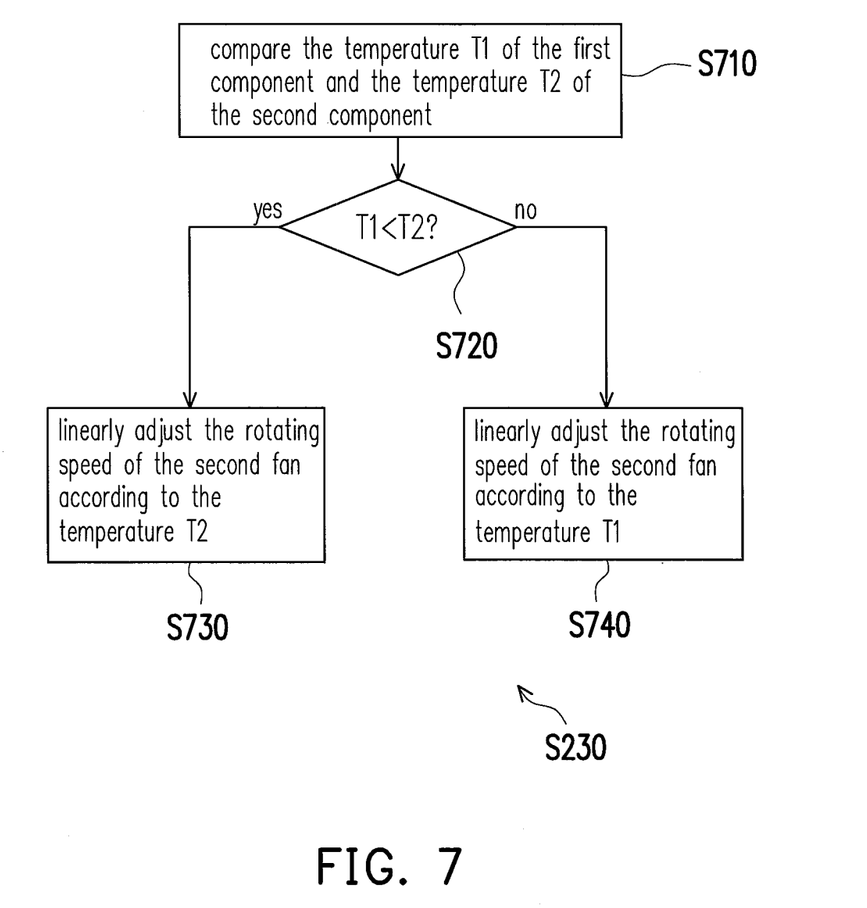
FIG. 7 is a flow chart showing a sub-process of a step S230 in FIG. 2 in a second embodiment.

FIG. 7 is a flow chart showing a sub-process of a step S230 in FIG. 2 in a second embodiment. As shown in FIG. 7, the step S230 includes sub steps S710 to S740. Please refer to FIG. 1 and FIG. 7, the control unit 170 compares the temperature T1 of the first component (such as the GPU 110) and the temperature T2 of the second component (such as the power supply circuit 120) in step S710.

The control unit 170 determines whether the temperature T1 is lower than the temperature T2 in S720. When the temperature T1 of the GPU 110 is lower than the temperature T2 of the power supply circuit 120, the control unit 170 linearly or discretely adjusts the rotating speed of the second fan 160 according to the temperature T2 of the power supply circuit 120 in step S730. The way of linearly adjusting the rotating speed of the second fan 160 according to the temperature T2 is similar to that in the embodiment shown in FIG. 6A. The way of discretely adjusting the rotating speed of the second fan 160 according to the temperature T2 is similar to that in the embodiment shown in FIG. 6B.

When the temperature T1 of the GPU 110 is higher than the temperature T2 of the power supply circuit 120, the control unit 170 linearly or discretely adjusts the rotating speed of the second fan 160 according to the temperature T1 of the GPU 110 in step S740. The way of linearly adjusting the rotating speed of the second fan 160 according to the temperature T1 is similar to that in the embodiment shown in FIG. 4A. The way of discretely adjusting the rotating speed of the second fan 160 according to the temperature T1 is similar to that in the embodiment shown in FIG. 4B.

Figure 8:
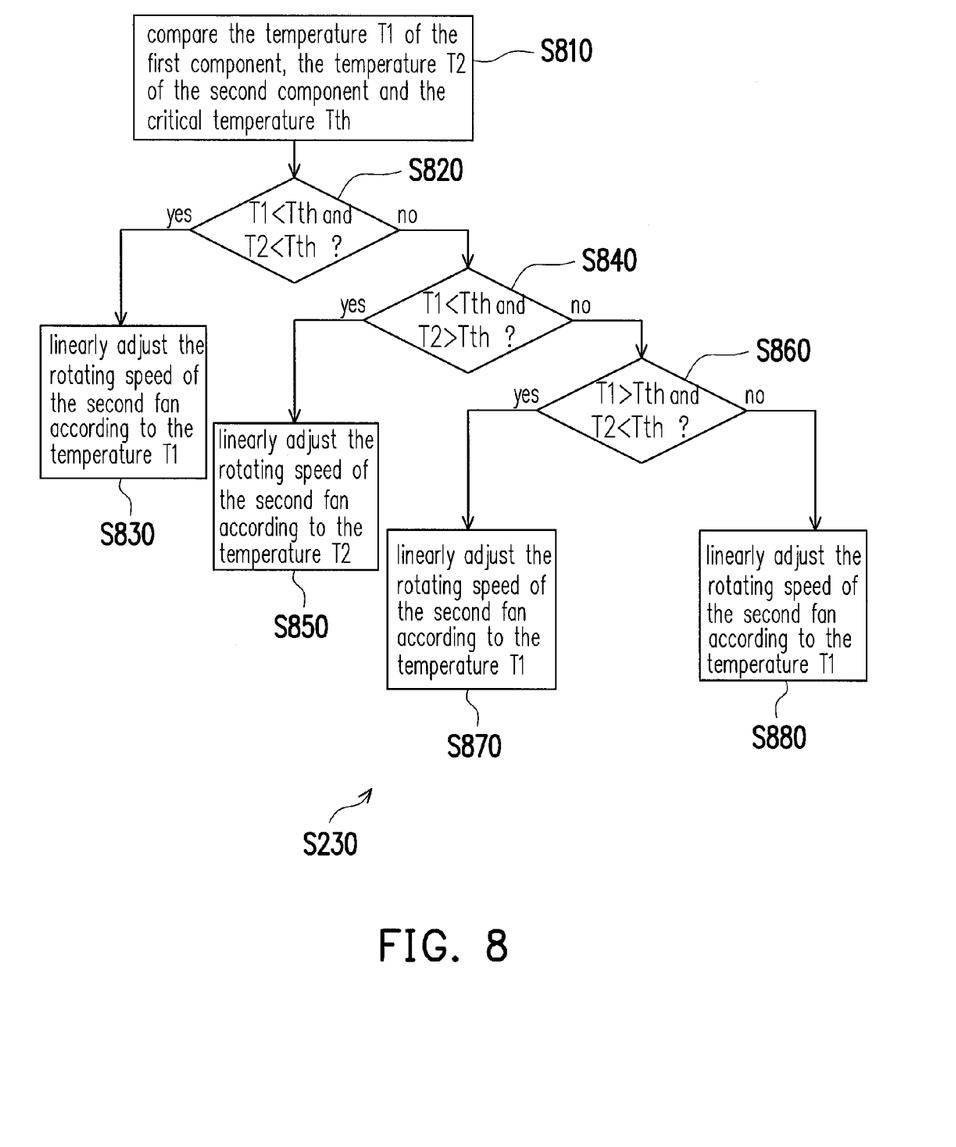
FIG. 8 is a flow chart showing a sub-process of a step S230 in FIG. 2 in a third embodiment.

FIG. 8 is a flow chart showing a sub-process of a step S230 in FIG. 2 in a third embodiment. As shown in FIG. 8, the step S230 includes sub steps S810 to S880. Please refer to FIG. 1 and FIG. 8, the control unit 170 compares the temperature T1 of the first component (such as the GPU 110), the temperature T2 of the second component (such as the power supply circuit 120) and the predetermined temperature Tth in step S810. The predetermined temperature Tth may be determined according to requirements of products.

The control unit 170 determines whether the temperature T1 is lower than the predetermined temperature Tth and the temperature T2 is lower than the predetermined temperature Tth in step S820. When the temperature T1 of the GPU 110 is lower than the predetermined temperature Tth and the temperature T2 of the power supply circuit 120 is lower than the predetermined temperature Tth, the control unit 170 linearly or discretely adjusts the rotating speed of the second fan 160 according to the temperature T1 of the GPU 110 in step S830. The way of linearly adjusting the rotating speed of the second fan 160 according to the temperature T1 is similar to that in the embodiment shown in FIG. 4A. The way of discretely adjusting the rotating speed of the second fan 160 according to the temperature T1 is similar to that in the embodiment shown in FIG. 4B.

If the determining result in S820 is no, the control unit 170 determines whether the temperature T1 is lower than the predetermined temperature Tth and the temperature T2 is higher than the predetermined temperature Tth in step S840. When the temperature T1 of the GPU 110 is lower than the predetermined temperature Tth and the temperature T2 of the power supply circuit 120 is higher than the predetermined temperature Tth, the control unit 170 linearly or discretely adjusts the rotating speed of the second fan 160 according to the temperature T2 of the power supply circuit 120 in step S850. The way of linearly adjusting the rotating speed of the second fan 160 according to the temperature T2 is similar to that in the embodiment shown in FIG. 6A. The way of discretely adjusting the rotating speed of the second fan 160 according to the temperature T2 is similar to that in the embodiment shown in FIG. 6B.

If the determining result in S840 is no, the control unit 170 determines whether the temperature T1 is higher than the predetermined temperature Tth and the temperature T2 is lower than the predetermined temperature Tth in S860. When the temperature T1 of the GPU 110 is higher than the predetermined temperature Tth and the temperature T2 of the power supply circuit 120 is lower than the predetermined temperature Tth, the control unit 170 linearly or discretely adjusts the rotating speed of the second fan 160 according to the temperature T1 of the GPU 110 in step S870. When the determining result in S860 is no (for example, the temperature T1 of the GPU 110 and the temperature T2 of the power supply circuit 120 are both higher than the predetermined temperature Tth), the control unit 170 linearly or discretely adjusts the rotating speed of the second fan 160 according to the temperature T1 of the GPU 110 in step S880.

Figure 9:
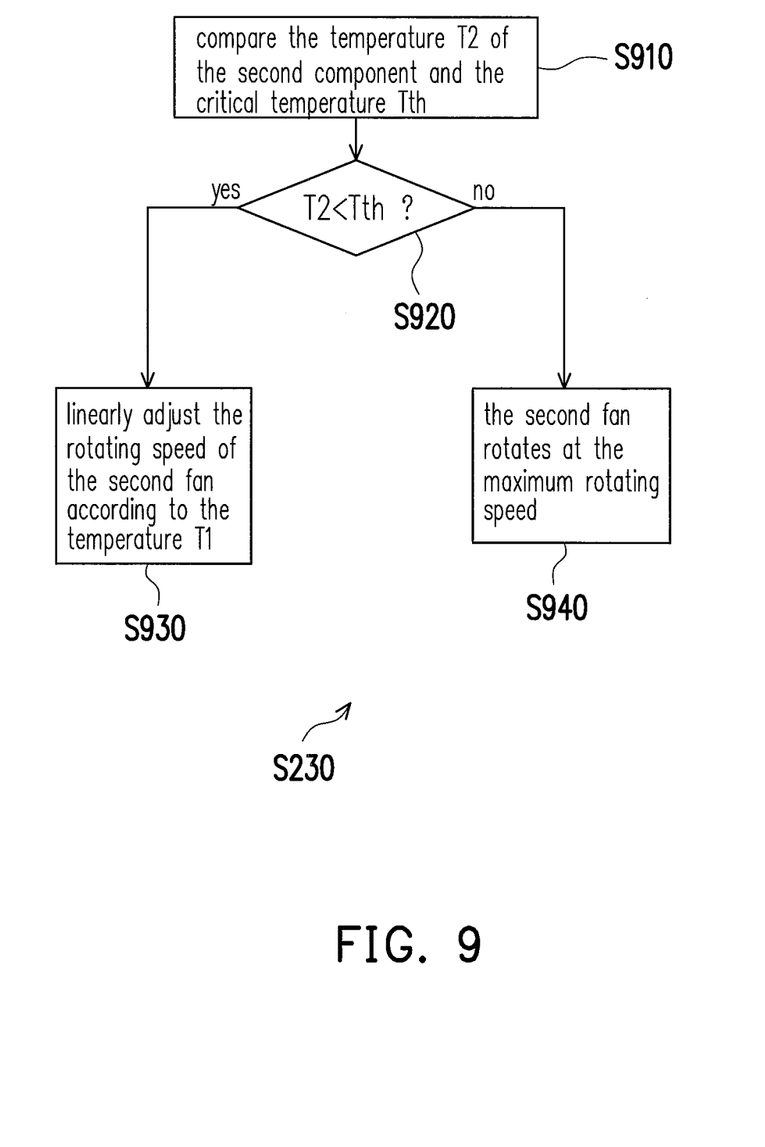
FIG. 9 is a flow chart showing a sub-process of a step S230 in FIG. 2 in a fourth embodiment.

FIG. 9 is a flow chart showing a sub-process of a step S230 in FIG. 2 in a fourth embodiment. In the embodiment shown in FIG. 9, the step S230 includes sub steps S910 to S940. Please refer to FIG. 1 and FIG. 9, the control unit 170 compares the temperature T2 of the second component (such as the power supply circuit 120) and the predetermined temperature Tth in step S910. The predetermined temperature Tth may be determined according to requirements of products.

The control unit 170 determines whether the temperature T2 is lower than the predetermined temperature Tth in S920. When the temperature T2 of the power supply circuit 120 is lower than the predetermined temperature Tth, the control unit 170 linearly or discretely adjusts the rotating speed of the second fan 160 according to the temperature T1 of the first component (such as the GPU 110) in S930. The way of linearly adjusting the rotating speed of the second fan 160 according to the temperature T1 is similar to that in the embodiment shown in FIG. 4A. The way of discretely adjusting the rotating speed of the second fan 160 according to the temperature T1 is similar to that in the embodiment shown in FIG. 4B. When the temperature T2 of the power supply circuit 120 is higher than the predetermined temperature Tth, the control unit 170 controls the second fan 160 to rotate at the maximum rotating speed in step S940.

In sum, the control unit 170 can detect the temperature of different components of the graphic card 100. The control unit 170 adjusts the rotating speed of the first fan 150 of the graphic card 100 according to the temperature of the first component (such as the GPU 110). The control unit 170 adjusts the rotating speed of the second fan 160 of the graphic card 100 according to the temperature of the first component and the second component (such as the power supply circuit 120) or the temperature of the second component. Thus, the graphic card 100 can adjust the rotating speed of the multiple fans according to the temperature of different components.

Although the present disclosure has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A controlling method of a graphic card with multiple fans, comprising following steps:
    detecting temperature of a graphics processing unit of the graphic card through a first temperature sensor disposed thereon;
    detecting temperature of a power supply circuit of the graphic card through a second temperature sensor disposed thereon;
    adjusting a rotating speed of a first fan of the graphic card according to the temperature of the graphics processing unit; and
    adjusting the rotating speed of a second fan according to a comparing result between the temperature of the graphics processing unit, the temperature of the power supply circuit and predetermined temperature, wherein the temperature of the graphics processing unit, the temperature of the power supply circuit, and the predetermined temperature are compared for linearly or discretely adjusting the rotating speed of the second fan according to the temperature of the graphics processing unit or the power supply circuit.

2. The controlling method according to claim 1, wherein the step of adjusting the rotating speed of the second fan further includes:
    adjusting the rotating speed of the second fan linearly or discretely according to the temperature of the power supply circuit when the temperature of the graphics processing unit is lower than the temperature of the power supply circuit.

3. The controlling method according to claim 1, wherein the step of adjusting the rotating speed of the second fan further includes:
    adjusting the rotating speed of the second fan linearly or discretely according to the temperature of the graphics processing unit when the temperature of the graphics processing unit is higher than the temperature of the power supply circuit.

4. The controlling method according to claim 1, wherein the step of adjusting the rotating speed of the second fan further includes:
    adjusting the rotating speed of the second fan linearly or discretely according to the temperature of the graphics processing unit when the temperature of the graphics processing unit is lower than the predetermined temperature and the temperature of the power supply circuit is lower than the predetermined temperature.

5. The controlling method according to claim 1, wherein the step of adjusting the rotating speed of the second fan further includes:
    adjusting the rotating speed of the second fan linearly or discretely according to the temperature of the power supply circuit when the temperature of the graphics processing unit is lower than the predetermined temperature and the temperature of the power supply circuit is higher than the predetermined temperature.

6. The controlling method according to claim 1, wherein the step of adjusting the rotating speed of the second fan further includes:
    adjusting the rotating speed of the second fan linearly or discretely according to the temperature of the graphics processing unit when the temperature of the graphics processing unit is higher than the predetermined temperature and the temperature of the power supply circuit is lower than the predetermined temperature.

7. The controlling method according to claim 1, wherein the step of adjusting the rotating speed of the second fan further includes:
    adjusting the rotating speed of the second fan linearly or discretely according to the temperature of the graphics processing unit when the temperature of the graphics processing unit is higher than the predetermined temperature and the temperature of the power supply circuit is higher than the predetermined temperature.

8. A graphic card with multiple fans, comprising:
    a graphics processing unit disposed at the graphic card;
    a power supply circuit disposed at the graphic card;
    a first temperature sensor disposed on the graphics processing unit to detect temperature thereof;
    a second temperature sensor disposed on the power supply circuit to detect temperature thereof;
    a first fan providing first cooling air to the graphic card;
    a second fan providing second cooling air to the graphic card; and
    a control unit coupled to the first temperature sensor, the second temperature sensor, the first fan and the second fan, wherein the control unit adjusts a rotating speed of the first fan according to the temperature of the graphics processing unit, and the control unit adjusts the rotating speed of the second fan according to the temperature of the power supply circuit or the temperature of the graphics processing unit and the power supply circuit,
    wherein the control unit compares the temperature of the graphics processing unit, the temperature of the power supply circuit and predetermined temperature for linearly adjusting the rotating speed of the second fan according to the temperature of the graphics processing unit or the power supply circuit.

9. The graphic card according to claim 8, wherein when the control unit compares the temperature of the graphics processing unit and the temperature of the power supply circuit, and the temperature of graphics processing unit is lower than the temperature of the power supply circuit, the control unit linearly adjusts the rotating speed of the second fan according to the temperature of the power supply circuit, and when the temperature of the graphics processing unit is higher than the temperature of the power supply circuit, the control unit linearly adjusts the rotating speed of the second fan according to the temperature of the graphics processing unit.

10. The graphic card according to claim 8, wherein when the control unit compares the temperature of the graphics processing unit, the temperature of the power supply circuit and predetermined temperature, and the temperature of the graphics processing unit and the temperature of the power supply circuit are lower than the predetermined temperature, the control unit linearly adjusts the rotating speed of the second fan according to the temperature of the graphics processing unit, when the temperature of the graphics processing unit is lower than the predetermined temperature and the temperature of the power supply circuit is higher than the predetermined temperature, the control unit linearly adjusts the rotating speed of the second fan according to the temperature of the power supply circuit, when the temperature of the graphics processing unit is higher than the predetermined temperature and the temperature of the power supply circuit is lower than the predetermined temperature, the control unit linearly adjusts the rotating speed of the second fan according to the temperature of the graphics processing unit, and when the temperature of the graphics processing unit and the temperature of the power supply circuit are higher than the predetermined temperature, the control unit linearly adjusts the rotating speed of the second fan according to the temperature of the graphics processing unit.

* * * * *